United States Patent

Grubb et al.

4,022,947

May 10, 1977

[54] TRANSPARENT PANEL HAVING HIGH REFLECTIVITY FOR SOLAR RADIATION AND A METHOD FOR PREPARING SAME

[75] Inventors: Albany D. Grubb, Walnut Creek; Thomas S. Mosakowski, Concord; Terry A. Trumbly, Pleasant Hill, all of Calif.

[73] Assignee: Airco, Inc., Montvale, N.J.

[22] Filed: Nov. 6, 1975

[21] Appl. No.: 629,459

[52] U.S. Cl. .............................. 428/432; 148/6.35; 204/192 R; 350/1; 427/38; 428/332; 428/433; 428/469; 428/472; 428/539; 428/913

[51] Int. Cl.² ..................... G02B 1/12; C03C 17/06; B32B 17/06; B32B 15/04

[58] Field of Search ......... 428/469, 472, 432, 433, 428/913, 539, 332–336; 350/1; 427/35, 38; 204/192 R, 192 OP, 192 IP; 148/6.3, 6.35

[56] References Cited

UNITED STATES PATENTS

| | | | |
|---|---|---|---|
| 3,826,728 | 7/1974 | Chambers et al. | 427/35 X |
| 3,843,405 | 10/1974 | Bourg | 427/35 |
| 3,846,152 | 11/1974 | Franz | 428/333 |
| 3,914,516 | 10/1975 | Ritter | 428/539 X |
| 3,915,757 | 10/1975 | Engel | 427/38 X |
| 3,916,034 | 10/1975 | Tsuchimoto | 427/38 |
| 3,935,351 | 1/1976 | Franz | 428/469 |
| 3,936,579 | 2/1976 | Ogasawara et al. | 350/1 X |
| 3,944,440 | 3/1976 | Franz | 148/6.3 |
| 3,978,272 | 8/1976 | Donley | 428/469 X |

*Primary Examiner*—Harold Ansher
*Attorney, Agent, or Firm*—David A. Draegert; Edmund W. Bopp

[57] ABSTRACT

Disclosed is a transparent panel capable of transmitting a desired proportion of visible radiation while reflecting a large proportion of incident solar radiation, and a method of preparing same, by sputtering an iron, nickel and chromium alloy to obtain a transparent metal film, and reactively sputtering the same or a similar alloy in the presence of oxygen. In one preferred embodiment, the metal film lies between the substrate and the metal oxide film which provides a continuous protective overlayer. In another preferred embodiment, the metal oxide film lies between the substrate and the metal film. The use of such panels can materially reduce the energy required for summer air conditioning when used for glazing in a building, vehicle or other structure.

15 Claims, 8 Drawing Figures

TRANSPARENT SUBSTRATE

TRANSPARENT PANEL HAVING HIGH REFLECTIVITY FOR SOLAR RADIATION AND A METHOD FOR PREPARING SAME

BACKGROUND OF THE INVENTION

1. Field of the Invention

This invention relates to a transparent panel of particular value in buildings, vehicles or other structures where it is desired to admit light while excluding much of the solar energy, thus decreasing the amount of air conditioning or cooling required and conserving energy. This panel comprises a transparent substrate, a thin metal film containing predominantly iron, nickel and chromium, and a metal oxide film containing predominantly the oxides of the same three metals. Preferably, the metal film is deposited by sputtering a suitable alloy in an inert gas, and the metal oxide film is formed by reactively sputtering the same or a similar alloy in the presence of oxygen. This multilayer coating has been found to be highly reflective to infrared radiation while transmitting a desired proportion of visible radiation. Thus, the coating serves to reject a large fraction of the incident solar energy. Further, when the metal oxide film is an overlayer, it provides a durable protective coating for the metal film.

2. Description of the Prior Art

For many years the glass industry has employed several different methods of altering the optical properties of panels used as windows in the automotive and building industries. Some of these methods consist of coating glass or plastic substrates by various methods such as chemical vapor deposition and physical vapor deposition, including sputtering. The optical properties of panels are also modified by altering the composition of the bulk substrate material. Products manufactured by these methods have been only partially successful in reflecting solar radiation to the degree required for significant energy conservation.

Satisfactory coatings for architectural uses are obtained only when the coating process is capable of producing a film of uniform composition and thickness. Further, the process must not warp or otherwise degrade the substrate by overheating. Even when a uniform film is produced it must usually be protected against atmospheric corrosion and abrasion resulting from wind born dirt and periodic cleaning.

Where fragile films are used in architectural panels, the panels are often mounted such that the film is on an interior surface which is not exposed to the weather. Some films must be further protected by mounting them such that the film is on an interior surface of a two panel composite. When a panel is mounted such that the reflecting film is on an inner surface, the solar radiation must pass through the substrate twice, first as it enters and then as it leaves, thus warming the substrate even more than with a single pass.

A fragile metal film is also protected by overlaying the metal film with a film of various metal oxides. U.S. Pat. No. 3,826,728 discloses an architectural panel in which a sputtered film of nickel-base alloy, such as INCONEL 610, is overlayed with a film of silicon oxide or aluminum oxide. U.S. Pat. No. 3,846,152 discloses an architectural panel in which a film of nickel is overlayed with a film of copper oxide.

When both the metal film and the protective material are applied by sputtering, the use of two different sputtering targets is frequently required. Further, two separate power sources are generally required becasue a direct (d.c.) potential is preferred for sputtering a metal target, but a radio frequency alternating (a.c.) potential is preferred for sputtering a non-conductive target, such as aluminum oxide.

In coating a substrate by sputtering, the substrate is placed near a target where it can receive the sputtered material. The system is contained within a chamber which is evacuated, and a quantity of an inert gas, such as argon, is admitted. In d.c. sputtering, an electric potential, generally of several hundred volts, is applied between an anode and the cathode target to produce a glow discharge plasma. Inert gas ions formed in the plasma are attracted to the cathode target where they impact and erode the target material. The sputtered atoms deposit on the substrate and form a coating on the surface.

In has been observed that the chemical composition of the deposit obtained by d.c. sputtering is substantially the same as that of the bombarded target, and that the film adheres to the substrate more strongly than films obtained by such processes as vacuum evaporation.

In reactive sputtering, a gas, such as oxygen, which will chemically react with the target material, is admitted to the chamber during the sputtering process. The substrate becomes coated with the reaction product of the target material and the reactive gas.

Sputtering is ordinarily a relatively slow process, but the rate can be significantly increased by utilizing a magnetic field to confine the glow discharge plasma. One such source is described in an article by John S. Chapin entitled "The Planar Magnetron" which was published in Research/Development January 1974, pp. 37–40.

SUMMARY OF THE INVENTION

The present invention is directed to a transparent panel having a high degree of reflectivity for solar radiation. The panel comprises a substrate, a continuous metal film comprising predominantly iron, nickel and chromium, and an oxide film comprising the oxides of the same three metals.

The substrate may be a crystal, a glass, a polymer or other similar transparent material. In one embodiment the metal film lies between the substrate and the metal oxide film which provides a durable protective overlayer. In another embodiment the metal oxide layer lies between the substrate and the metal layer.

The invention is also directed to a method of producing the product panel. The metal film is preferably deposited by sputtering a target of a first alloy in the range about 0.5 to 81 weight percent iron, about 3 to 85 percent nickel and about 14 to 26 percent chromium. The oxide film is preferably deposited by reactive sputtering a second alloy of the same composition range in the presence of oxygen. The first alloy and the second alloy may be the same, in which case the metal radicals of the oxide film are present in substantially the same proportions as the proportions of the metals elements in the metal film.

The composition range just indicated includes most of the standard AISI series of austenitic stainless steels and the series of INCONEL alloys currently marketed by International Nickel Corporation. Two alloys, 316 stainless steel and INCONEL 600 alloy are especially preferred because of their superior resistance to corrosion caused by atmospheric exposure.

A transparent panel produced according to the invention reflects a surprisingly large proportion of incident solar radiation. Any desired fraction of the visible radiation can be transmitted depending upon the thickness of the metal film.

A panel has a characteristic color when viewed by reflected daylight with the oxide film, rather than the metal film, toward the observer. Because of optical interference phenomena, different colors are obtained depending upon the thickness of the metal oxide film. In the order of increasing thickness, the first order interference colors are silver, gold, red and blue. For still thicker layers, the second order interference colors appear in the order, silver, yellow, red, purple, blue and green.

If the metal film is placed between two films of metal oxide, then the panel can have the same or a different appearance when viewed from different sides.

When used as an overlayer, the metal oxide film provides a durable protective coating for the metal film. Because this coating will withstand weathering and considerable abrasion, the panel may be mounted with its coated surface as the exterior surface of a building or vehicle.

DESCRIPTION OF THE PREFERRED EMBODIMENT

Figure 6:
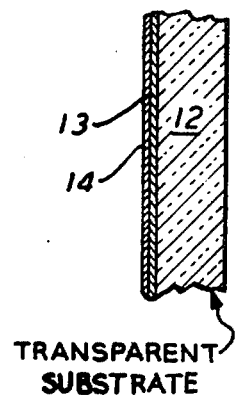
FIG. 6 is a cross-sectional view of a transparent architectural panel produced in accordance with this invention.

The invention is directed, first to a product, which comprises a transparent substrate, a continuous metal film comprising predominantly iron, nickel and chromium, and an oxide film comprising the oxides of the same three metals. With reference to FIG. 6, in a first embodiment, the inner layer 13 next to the substrate is metal and the outer layer 14 is metal oxide. In a second embodiment the inner layer 13 is metal oxide and the outer layer 14 is metal. In the second embodiment, the metal layer is preferably overlayed with a layer of protective material (not shown). The protective material may be glass, plastic or a layer of metal oxide.

The substrate is preferably a material which has superior structural properties and minimal absorption in the visible and near-infrared spectral regions where the solar energy is concentrated. Crystalline quartz, fused silica, soda-lime silicate glass, and plastics such as the polycarbonates and acrylics are all preferred substrate materials.

The metal elements of the metal film are preferably in the range about 0.5 to 81 weight percent iron, about 3 to 85 percent nickel and about 14 to 26 percent chromium. The metal film thickness is preferably between 3 and 60 nanometers (nm), depending upon the desired transmittance of visible radiation. The metal radicals in the metal oxide film are also preferably in the range about 0.5 to 81 weight percent iron, about 3 to 85 percent nickel and about 14 to 26 percent chromium. If a durable protective film is desired, the metal oxide film thickness should be greater than about 10 nm. Thicknesses greater than about 300 nm are possible, but generally not desirable because of the required processing time.

The invention is also directed to a method of producing the above characterized product by sputtering. Sputter coating is preferred because a substrate can be coated with films having uniform thickness and composition. A continuous metal film can be produced with few "pin holes" which allow radiation to pass unattenuated. Similarly, a continuous oxide film can be produced with a uniform appearance and with few voids to subject an underlying metal film to localized corrosive attack.

Figure 1:
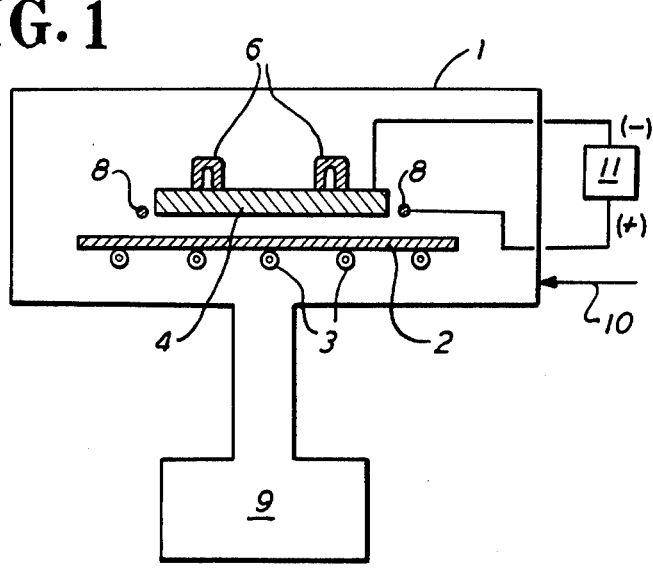
FIG. 1 is a diagramatic representation of a sputtering apparatus for depositing a metal film and a metal oxide film according to the invention. The substrate 2, target 4 and anode 8 are shown in transverse section.
Figure 2:
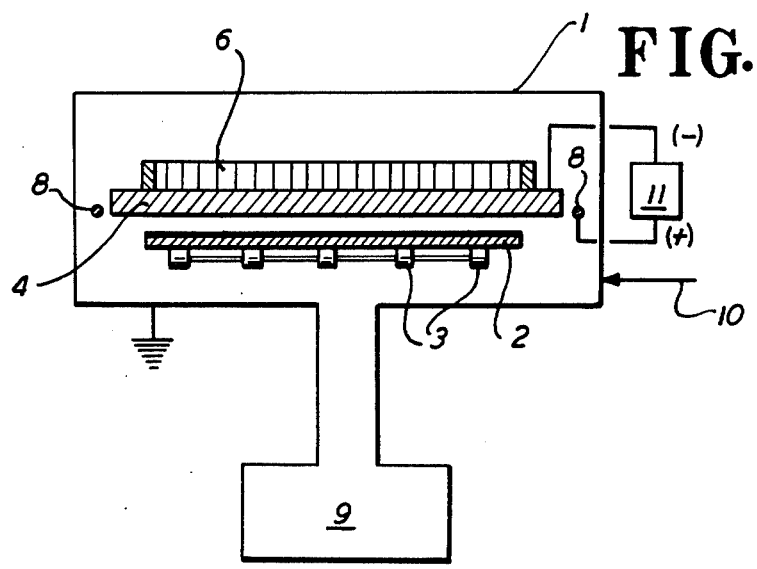
FIG. 2 is a diagramatic representation of the apparatus of FIG. 1, with the substrate, target and anode shown in longitudinal section.

A sputtering apparatus suitable for producing a transparent panel according to the invention is shown in FIGS. 1 and 2. A chamber 1 is provided with a conventional means 9, such as a diffusion pump, for evacuating the chamber. A number of rollers 3 and other means (not shown) are provided for passing the substrate 2 back and forth adjacent the target 4. The substrate position, whether horizontal or vertical or whether above or below the target, is not critical, but it is preferred that the substrate be moved in a horizontal plane parallel to and beneath the target. A conventional power supply 11, preferably a constant current supply, is connected between the cathode target 4 and an anode 8. The anode must be an electrical conductor but the shape, location and composition of the anode are not critical.

Figure 3:
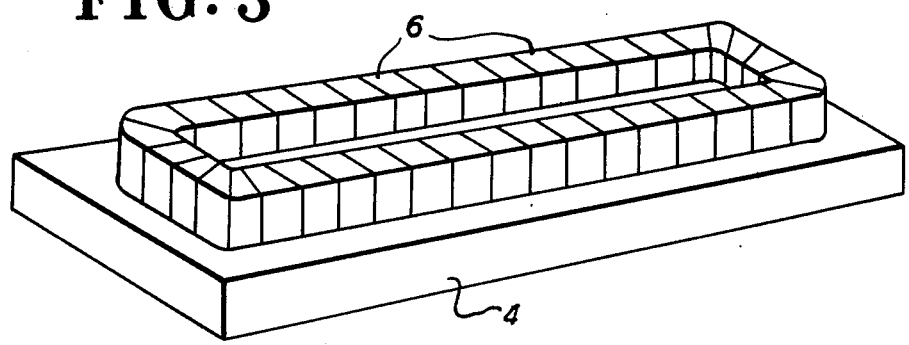
FIG. 3 is a perspective view of a target with an array of permanent magnets 6 for confining the glow discharge plasma to increase the rate of deposition on the substrate.
Figure 4:
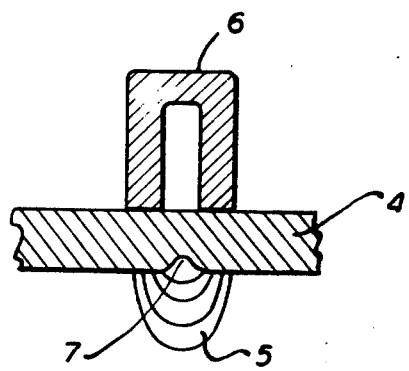
FIG. 4 is an enlarged transverse section of the target and a permanent magnet which illustrates the general shape of the lines of magnetic force 5 and the trough 7 which is eroded by the sputtering of the target.

The sputtering source shown is a planar magnetron source in which a particular magnetic field is used to concentrate and confine the glow discharge plasma. This is accomplished by arranging a number of magnets 6 around a closed path on the upper surface of the target as shown in FIG. 3. As illustrated in FIG. 4, the magnets produce a magnetic field having lines of force 5 which emerge from the target, extend into the space between the target and the substrate and return to the target. In operation, the glow discharge plasma is concentrated in a closed loop which lies near where the magnetic field is parallel to the surface of the target.

Consequently, as the sputtering process progresses, a trough 7 is eroded along a closed path on the surface of the target. A planar magnetron sputtering source is preferred because it allows production of uniform coatings on large surfaces at high deposition rates.

The target is preferably a flat plate of an alloy comprising predominantly the metals iron, nickel and chromium. In order to minimize shunting of the magnetic field of the planar magnetron source, it is preferred that the alloy be non-magnetic or only weakly magnetic.

The target alloy may be one of standard AISI austenitic stainless steels. The compositions of these stainless steel alloys are tabulated in Metals Handbook, American Society of Metals, Eighth Ed., Vol. 1, p. 409, 1961. These stainless steel alloys lie in the range from about 45 to 81 weight percent iron, about 3 to 22 percent nickel and about 16 to 26 percent chromium. Other metals may be present in lesser amounts.

Stainless steel types 316, 316L and 317 are especially preferred because of their high resistance to atmospheric corrosion. This especially preferred composition range is about 57 to 72 percent iron, 10 to 15 percent nickel and 16 to 21 percent chromium.

The especially preferred alloy stainless steel 316 has a nominal composition of 68 percent iron, 12 percent nickel and 17 percent chromium. In addition it contains 2% to 3% molybdenum, and up to 2% manganese, 1% silicon, 0.08% carbon, 0.045% phosphorus and 0.03% sulphur. Here, as throughout this specification, the alloy composition is specified by percentages given on a weight basis.

The target alloy may also be one of the series of INCONEL alloys currently marketed by the International Nickel Company. The compositions of these INCONEL alloys are tabulated in Huntington Alloys Handbook, The International Nickel Company, Fifth Ed. 1970. These INCONEL alloys lie in the range from about 30 to 85 weight percent nickel, about 0.5 to 46 percent iron and about 14 to 25 percent chromium. Other metals may be present in lesser amounts.

INCONEL alloys 600 and 610 are especially preferred because of their high resistance to atmospheric corrosion. This especially preferred composition range is about 5 to 10 percent iron, 70 to 81 percent nickel and 14 to 17 percent chromium.

The especially preferred INCONEL 600 alloy has a nominal composition of 8 percent iron, 76 percent nickel and 15.5 percent chromium. In addition it may contain a small but variable amount of cobalt, 0.08% carbon, 0.5% manganese, 0.008% sulphur, 0.25% silicon and 0.25% copper.

The choice of a particular alloy depends upon the features desired in the final product. Some comparisons of the properties of panels coated by sputtering INCONEL 600 alloy and 316 stainless steel will illustrate the factors involved. In general, the oxide layers formed by sputtering INCONEL alloy have softer, less saturated colors. Such colors may be more pleasing when the panels are used as the exterior walls of a building. Further, less saturated colors can provide slightly better solar rejection. Panels coated by reactively sputtering stainless steel have more vivid colors, which may be desirable when seeking to match the color of windows to that of the body of a vehicle. Simulated environmental testing of INCONEL coated panels have shown slight deterioration when subjected to heating and salt spray for extended periods. It is anticipated that stainless steel coated panels will be more resistive to abrasion and corrosive attack. In general, INCONEL targets are more expensive than stainless steel targets although the resulting difference in the cost of an individual panel is slight because of the thinness of the films.

In producing an architectural panel by the method of the invention, the substrate is placed in the chamber 1, which is then evacuated to a pressure of preferably less than 0.1 millitorr to remove unwanted reactive gases. Although not essential, the chamber may be flushed with the sputtering gas and re-evacuated to a pressure preferably less than about 1 millitorr.

The inert sputtering gas used for depositing the metal film may be a member of the rare gas family, such as helium, neon or argon. Argon is preferred, however, not only because of cost considerations, but because argon atoms have greater mass, and therefore the ions are more effective in the bombardment of the target.

The reactive sputtering gas used for depositing the metal oxide film may be an oxygen containing gas, such as pure oxygen, a mixture of oxygen and an inert gas, or an oxide gas, such as carbon dioxide.

The sputtering gas is admitted to the chamber through conduit 10. Preferably, the sputtering gas is added continuously during the sputtering process to maintain the desired pressure and composition of the gas in the chamber. The pressure is maintained by coordinating the rate of introduction, the rate of evacuation and the rate of utilization in the case of a reactive gas. The chamber pressure is not critical, but it should be substantially constant and sufficient to maintain a stable glow discharge at the chosen operating current. When a planar magnetron sputtering source is used, the preferred pressure is 2 to 5 millitorr (mT). The practical lower and upper limits are about 1 and 50 mT, respectively.

A glow discharge is established and maintained in the sputtering gas by the power supply 11 which imposes a d.c. electric potential of 200 to 1000 V between the anode and the cathode target. The current is maintained at a desired value in the range 4 to 300 A depending upon the area of the target.

The substrate is coated with a metal film when it passes by the cathode target in the inert sputtering gas and with a metal oxide film when in the reactive sputtering gas. The separation between the substrate and the target is preferably 3 to 25 cm. The film thickness may be varied by controlling the rate of movement and the number of times the substrate passes the target. Other factors which effect the thickness of the deposit are operating current, gas pressure, magnetic field intensity and the particular sputtering gas chosen. When the sputtering operations are complete, the chamber is brought to atmospheric pressure and the finished architectural glass is removed.

EXAMPLES

A target for a sputtering apparatus such as that referred to above, was fabricated from a plate of INCONEL 600 alloy. The target measured 35.5 cm × 135 cm × 2.54 cm and was attached to a closed loop magnet assembly which was 135 cm long. The anode consisted of a rod of 316 stainless steel which extended along the entire edge of the target.

The substrate was a 61 cm × 122 cm × 0.63 cm of commercially available soda-lime silicate glass. The substrate was first cleaned thoroughly by scrubbing with detergent, rinsing with a water spray, and drying with forced air. The substrate was placed in the chamber on a carrier which allowed the substrate to move past the target at a constant rate. The substrate moved in a horizontal plane parallel to the target surface and separated by a distance of 11 cm. The chamber was evacuated to a pressure less than 1 mT, then maintained at a pressure of 3 mT by the continuous addition of argon. A glow discharge was established and a constant current of 18A maintained. The d.c. potential was 560 V and the power consumption was 10.1 kW. The magnetic field intensity at the glow discharge was between 100 and 400 Gauss which has been found quite satisfactory for concentrating the glow discharge plasma. A metal film was deposited by moving the glass plate once past the target at a uniform rate of 5.0 cm/sec.

The argon was then turned off and the pressure maintained at 5 millitorr by introducing a reactive gas mixture of 20% oxygen and 80% argon. A constant current of 24 A was maintained with an electrical potential of 380 V and a power consumption of 9.1 kW. A metal oxide film was deposited by again moving the substrate once past the target at a rate of 1.3 cm/sec.

When the coated glass plate was removed from the chamber the thickness of the metal film was found to be about 25 nm which provides a transmittance of about 11% at the visible (green) wavelength of 550 nm. The reflectance was about 59% at the infrared wavelength of 3 $\mu$m. The thickness of the oxide film was found to be 80 nm which gives the coated side a gold hue when observed by reflected daylight. Although the unprotected metal film was relatively fragile, the metal oxide film provided a durable protective overlayer and a panel which was resistant to handling and weathering.

Various parameters for Example 1 and six additional examples are given in Table I. In each of these examples, the target was INCONEL 600, the substrate was glass, the metal film was deposited in a single pass with an inert gas of argon, and the oxide overlayer was deposited in a single pass with a reactive gas mixture of 20% oxygen and 80% argon.

Figure 5:
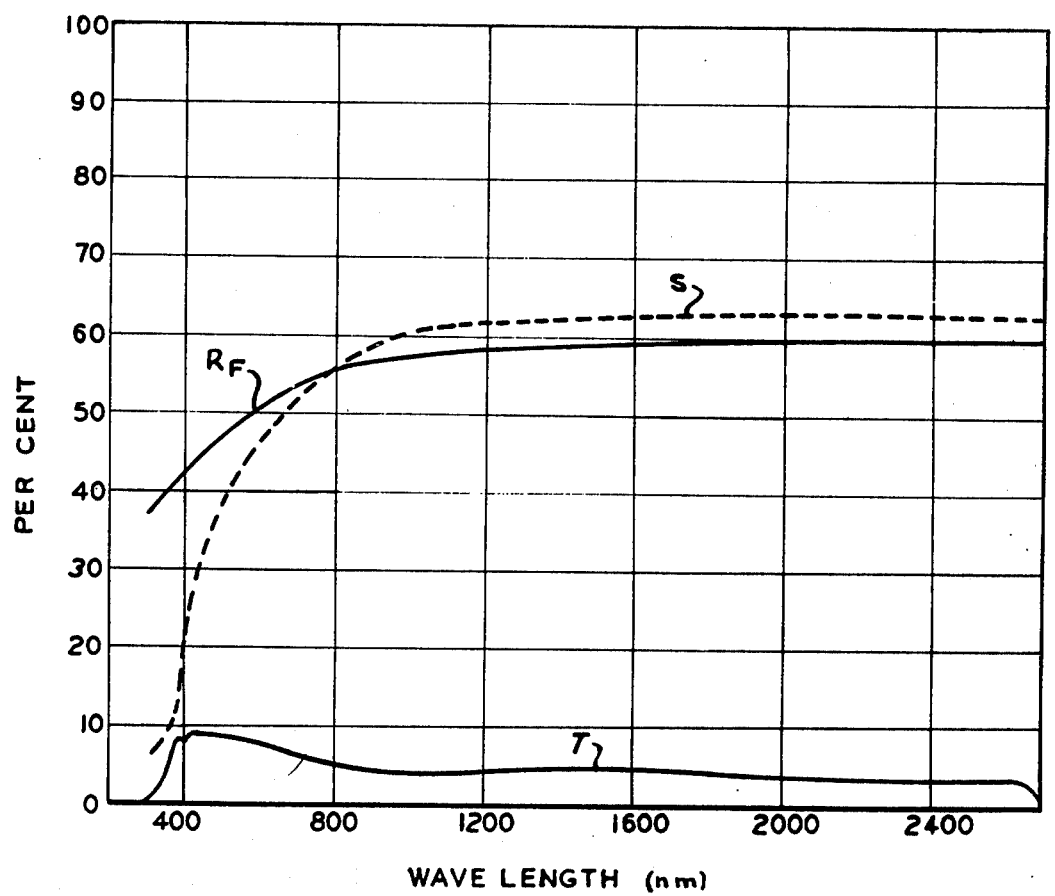
FIG. 5 is a graph illustrating the spectral transmittance and reflectance of a sample of architectural panel having a metal film deposited on the substrate by sputtering the INCONEL 600 alloy and a metal oxide overlayer formed by reactively sputtering the same alloy in the presence of oxygen.

Typical Spectral data for the coated glass plate of Example 4 are shown in FIG. 5. The transmittance curve T has a maximum value of about 9% in the visible and generally decreases slowly toward longer wavelengths. The transmittance curve for a sample having a thinner metal film also has this general shape, but, as indicated in Table I, the transmittance at a given visible wavelength increases rapidly as the metal film thickness decreases.

Curve $R_F$ in FIG. 5 is the reflectance of the film covered side of Example 4. Curve $R_F$ rises rapidly in the ultra-violet and continues to rise slowly as the wavelength increases. For thicker metal layers, the reflectance curve retains this general shape, but as indicated in Table I, the reflectance at a given infrared wavelength increases slowly as the metal film thickness increases.

Curve S in FIG. 5 represents reflectance data for Example 7 which had a metal film of approximately the same thickness as for curves $R_F$ and T, but which had a thicker layer of metal oxide. Comparing curves $R_F$ and S, increasing the thickness of the metal oxide layer tends to shift the reflectance curve toward longer wavelengths thereby producing a change in hue from silver to gold. As indicated in Table I, oxide films having thicknesses between about 30 and 80 nm have a gold hue; thinner oxide films have a silver hue.

A target for the sputtering apparatus was also fabricated from a plate of 316 stainless steel. Panels were prepared by coating glass substrates in a manner similar to that described for Example 1. Process and spectra data for four such panels are given in Table II. In each of these examples, the target was 316 stainless steel, the inert gas was argon and the metal layer was deposited in a single pass at the rate indicated in Table II. The reactive gas was commercially pure oxygen. The oxide layer was deposited in a number of passes which were at different rates in some instances, as indicated in Table II.

TABLE I:

| PROPERTIES OF FILMS OF SPUTTERED INCONEL 600 ALLOY | | | | | | | |
|---|---|---|---|---|---|---|---|
| EXAMPLE NUMBER | 1 | 2 | 3 | 4 | 5 | 6 | 7 |
| Metal Film | | | | | | | |
| Pressure (mT) | 3 | 3 | 2 | 2 | 2 | 2 | 2 |
| Potential (V) | 560 | 550 | 580 | 610 | 580 | 600 | 630 |
| Current (A) | 18 | 15 | 15 | 18 | 12 | 12 | 18 |
| Power (kW) | 10.1 | 8.2 | 8.7 | 11.0 | 7.0 | 7.2 | 11.3 |
| Rate of pass (cm/sec) | 4.9 | 4.9 | 4.6 | 4.6 | 4.9 | 4.9 | 4.6 |
| Film thickness (nm) | 25 | 20 | 20 | 30 | 10 | 10 | 30 |
| Metal Oxide Film | | | | | | | |
| Pressure (mT) | 5 | 5 | 5 | 5 | 5 | 5 | 5 |
| Potential (V) | 380 | 380 | 370 | 400 | 370 | 380 | 400 |
| Current (A) | 24 | 24 | 24 | 24 | 24 | 24 | 24 |
| Power (kW) | 9.1 | 9.1 | 8.9 | 9.6 | 8.9 | 9.1 | 9.6 |
| Rate of pass (cm/sec) | 1.3 | 6.2 | 1.3 | 6.2 | 1.3 | 1.0 | 1.3 |
| Film thickness (nm) | 80 | 20 | 80 | 20 | 60 | 30 | 60 |
| Transmittance at 500 nm | 11% | 13% | 14% | 9% | 20% | 20% | 8% |
| Reflectance at 3 $\mu$m | 59% | 55% | 57% | 60% | 49% | 42% | 63% |
| Hue by reflected light | gold | silver | gold | silver | gold | silver | gold |

TABLE II

| PROPERTIES OF FILMS OF SPUTTERED 316 STAINLESS STEEL | | | | |
|---|---|---|---|---|
| EXAMPLE NUMBER | 8 | 9 | 10 | 11 |
| Metal Film | | | | |
| Pressure (mT) | 3 | 3 | 3 | 3 |
| Potential (V) | 580 | 510 | 520 | 460 |
| Current (A) | 15 | 15 | 15 | 13 |
| Power (kW) | 8.7 | 7.8 | 7.8 | 5.8 |
| Rate of pass (cm/sec) | 4.9 | 4.9 | 4.9 | 4.9 |
| Film thickness (nm) | 20 | 18 | 18 | 13 |
| Metal Oxide Film | | | | |
| Pressure (mT) | 3 | 3 | 3 | 3 |
| Potential (V) | 360 | 380 | 380 | 380 |
| Current (A) | 21 | 24 | 24 | 24 |
| Power (kW) | 7.6 | 9.1 | 9.1 | 9.1 |
| No. of passes at Rate (cm/sec) | 1 at 1.0  1 at 6.2 | 2 at 1.0  1 at 2.3  1 at 6.2 | 7 at 1.0 | 8 at 1.0  1 at 1.62 |
| Film thickness (nm) | 15 | 50 | 120 | 150 |

TABLE II-continued
PROPERTIES OF FILMS OF SPUTTERED 316 STAINLESS STEEL

| EXAMPLE NUMBER | 8 | 9 | 10 | 11 |
|---|---|---|---|---|
| Transmittance at 550 nm | 10% | 9% | 6% | 8% |
| Reflectance at 3 μm | 56% | 55% | 43% | 46% |
| Hue by reflected light | gold | blue | red | purple |
| Interference Order | 1 | 1 | 2 | 2 |

The general behavior of the reflectance of Example 8 was similar to that of Example 7 as illustrated by curve S in FIG. 5. The transmittance of Example 8 resembled curve T of FIG. 5 but the maximum was broader resulting in less variation the visible spectral region from 400 to 800 nm.

Figure 7:
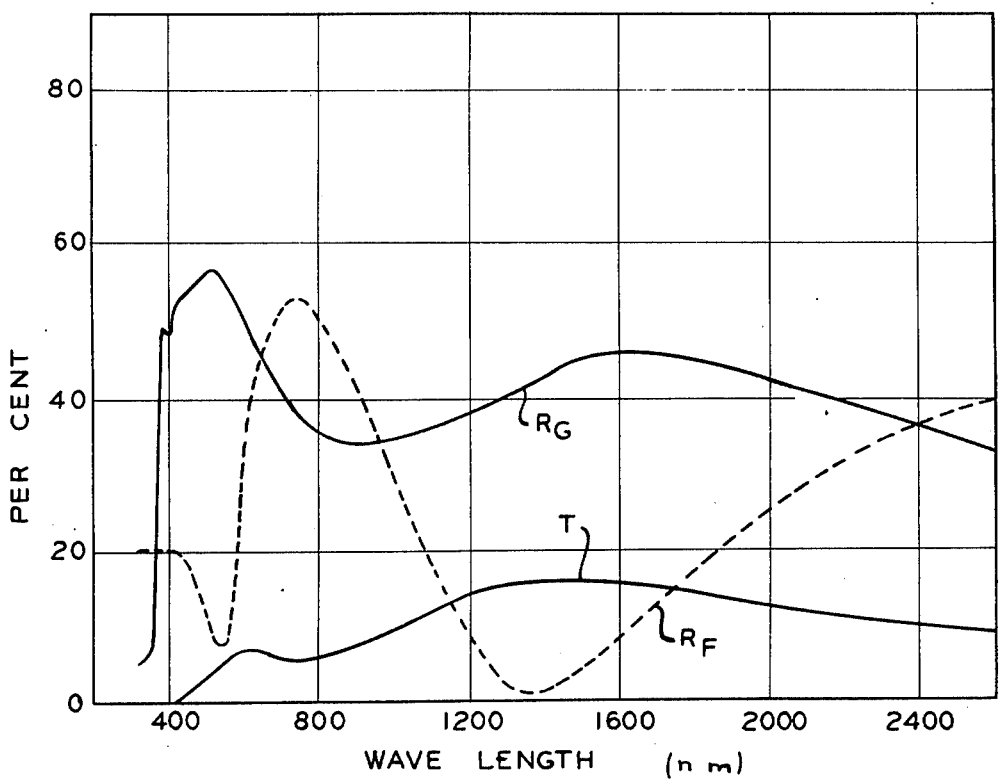
FIG. 7 is a graph illustrating the spectral transmittance and reflectrance of an architectural panel having a metal film deposited on the substrate by sputtering 316 stainless steel and a metal oxide overlayer formed by reactively sputtering the same alloy in the presence of oxygen.

Because of its thicker oxide layer, Example 10 exhibits a second order red hue when the film covered side is viewed in daylight. Curve $R_F$ in FIG. 7 illustrates the reflectance of this surface. This curve has a minima near 1300 nm, a maxima near 750 nm (red) and another minima near 520 nm. Related variations are evident in the transmittance of Example 10 as shown by curve T in FIG. 7. Curve $R_G$ in FIG. 7 illustrates the reflectance of the uncoated glass side of Example 10.

In the preceeding examples, the metal film was deposited directly on the substrate, and the metal oxide film was deposited as a protective overlayer. In the second embodiment of the invention, the metal oxide film lies between the substrate and the metal film. This second embodiment allows the appearance of the uncoated surface of the substrate to be varied depending upon the thickness of the metal oxide layer.

Example 11 was prepared according to the second embodiment. A film of metal oxide was deposited on a glass substrate by reactively sputtering in a mixture of 20% oxygen and 80% argon. A film of metal was then deposited by sputtering the same alloy in argon. Various data for Example 11 are given in Table II and FIG. 8.

Figure 8:
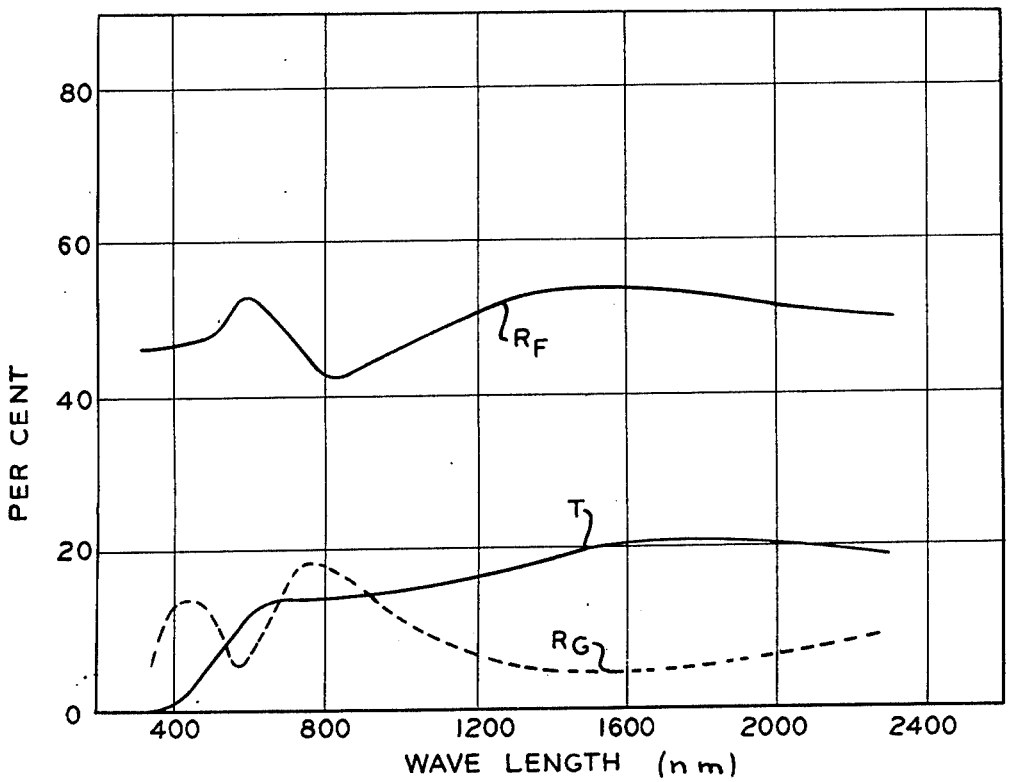
FIG. 8 is a graph illustrating the spectral properties of an architectural panel having an oxide film deposited on the substrate by reactively sputtering 316 stainless steel and a metal film deposited on the oxide film by sputtering the same alloy.

Curve $R_G$ in FIG. 8 is the reflectance of the uncoated glass side of the panel. This curve shows the influence of the metal oxide film which is between the other surface of the glass and the metal film. When viewed in daylight this uncoated surface has a purple hue characteristic of second order interference in the oxide film.

Curve $R_F$ in FIG. 8 is reflectance of the exposed metal film of Example 11. This curve somewhat resembles curve $R_G$ of FIG. 7. The shape of the transmittance curve T in FIG. 8 is also similar to that of curve T in FIG. 7.

What is claimed is:

1. A transparent article having a high reflectance for solar radiation, comprising:
    a transparent substrate;
    a metal film wherein the metal elements comprise 0.5 to 81 weight percent iron, 3 to 85 percent nickel and 14 to 26 percent chromium; and
    a metal oxide film wherein the metal radicals comprise 0.5 to 81 percent iron, 3 to 85 percent nickel, and 14 to 26 percent chromium.

2. The transparent article of claim 1 wherein the metal film has a thickness of 3 to 60 nm and the metal oxide film has a thickness of 10 to 300 nm.

3. The transparent article of claim 2 wherein the metal film in deposited by sputtering and the metal oxide film is deposited by reactive sputtering.

4. The transparent article of claim 3 wherein the metal elements and the metal radicals are in the range 45 to 81 weight percent iron, 3 to 22 percent nickel and 16 to 26 percent chromium.

5. The transparent article of claim 4 wherein the metal elements and the metal radicals are in the range 57 to 72 weight percent iron, 10 to 15 percent nickel and 16 to 21 percent chromium.

6. The transparent article of claim 3 wherein the metal elements and the metal radicals are in the range 0.5 to 46 weight percent iron, 30 to 85 percent nickel and 14 to 25 percent chromium.

7. The transparent article of claim 6 wherein the metal elements and metal radicals are in the range 5 to 10 weight percent iron, 70 to 81 percent nickel and 14 to 17 percent chromium.

8. The transparent article of claim 3 wherein the metal elements of the metal film are in the range 57 to 72 weight percent iron, 10 to 15 weight percent nickel and 16 to 21 percent chromium, and the metal radicals of the metal oxide film are in the range 5 to 10 weight percent iron, 70 to 81 percent nickel and 14 to 17 percent chromium.

9. The transparent article of claim 3 wherein the metal elements of the metal film are in the range 5 to 10 weight percent iron, 70 to 81 percent nickel, and 14 to 17 percent chromium, and the metal radicals of the metal oxide film are in the range 57 to 72 weight percent iron, 10 to 15 percent nickel, and 16 to 21 percent chromium.

10. The transparent article of claim 3 wherein the metal film lies between the substrate and the metal oxide film.

11. The transparent article of claim 3 wherein the metal oxide film lies between the substrate and the metal film and further comprising an overlayer for protecting the metal film.

12. The transparent article of claim 11 wherein the protective overlayer comprises a layer of metal oxides wherein the metal radicals are predominantly iron, nickel and chromium.

13. The transparent article of claim 3, wherein the substrate is glass.

14. The transparent article of claim 3, wherein the substrate is a polymeric material.

15. A method of rejecting solar energy while admitting visible radiation to a structure having an opening, comprising:
    covering the opening with a transparent panel according to claim 1.

* * * * *